US012580567B2

(12) United States Patent
Hiraki

(10) Patent No.: US 12,580,567 B2
(45) Date of Patent: Mar. 17, 2026

(54) KEY SWITCH DEVICE AND KEY SWITCH CONTROL METHOD

(71) Applicant: TOPRE CORPORATION, Tokyo (JP)

(72) Inventor: Seiji Hiraki, Sagamihara (JP)

(73) Assignee: TOPRE CORPORATION, Tokyo (JP)

( * ) Notice: Subject to any disclaimer, the term of this patent is extended or adjusted under 35 U.S.C. 154(b) by 221 days.

(21) Appl. No.: 18/463,423

(22) Filed: Sep. 8, 2023

(65) Prior Publication Data

US 2024/0088895 A1 Mar. 14, 2024

(30) Foreign Application Priority Data

Sep. 13, 2022 (JP) ................................. 2022-145313

(51) Int. Cl.
*H03K 17/965* (2006.01)
*H01H 13/14* (2006.01)

(52) U.S. Cl.
CPC ........... *H03K 17/965* (2013.01); *H01H 13/14* (2013.01)

(58) Field of Classification Search
CPC ...... H03K 17/965; H01H 13/14; H01H 13/70; G06F 3/038; G06F 3/023; H03M 11/20
See application file for complete search history.

(56) References Cited

U.S. PATENT DOCUMENTS

| | | | |
|---|---|---|---|
| 10,325,734 B1 * | 6/2019 | Iijima | H01H 13/14 |
| 2010/0127983 A1 | 5/2010 | Irani et al. | |
| 2015/0116205 A1 | 4/2015 | Westerman et al. | |
| 2015/0227280 A1 | 8/2015 | Westerman et al. | |
| 2015/0234493 A1 | 8/2015 | Parivar et al. | |
| 2016/0162031 A1 | 6/2016 | Westerman et al. | |
| 2017/0346488 A1 * | 11/2017 | Minezaki | G06F 3/0202 |
| 2018/0040440 A1 * | 2/2018 | Enomoto | H01H 13/83 |
| 2019/0243466 A1 | 8/2019 | Sato et al. | |
| 2020/0050284 A1 * | 2/2020 | Toyosawa | H01H 13/83 |

FOREIGN PATENT DOCUMENTS

| | | |
|---|---|---|
| JP | 2018-67134 A | 4/2018 |
| WO | 2013/169299 A1 | 11/2013 |

OTHER PUBLICATIONS

European Search Report issued on Jan. 30, 2024 in a counterpart European patent application.

* cited by examiner

*Primary Examiner* — Sahlu Okebato
(74) *Attorney, Agent, or Firm* — METROLEX IP LAW GROUP, PLLC; Robert L. Scott, Esq.

(57) ABSTRACT

A key switch device includes: a key that is configured to output a signal corresponding to a pressing amount; a pressing amount detector that is configured to detect the pressing amount of the key; an A/D converter that is configured to convert the pressing amount of the key into digital data; and a RAM that is configured to store multiple operating points for switching between ON and OFF states of the key according to the digital data. In addition, the key switch device includes an output signal control unit that is configured to output an ON signal when the pressing amount exceeds any one of the operating points in a direction in which the pressing amount of the key increases, and to output an OFF signal when the pressing amount falls below any one of the operating points in a direction in which the pressing amount of the key decreases.

4 Claims, 6 Drawing Sheets

FIG. 5

KEY SWITCH DEVICE AND KEY SWITCH CONTROL METHOD

CROSS-REFERENCE TO RELATED APPLICATIONS

The present application is based on, and claims priority from Japanese Patent Application No. 2022-145313, filed on Sep. 13, 2022, the entire contents of which are incorporated herein by reference.

BACKGROUND OF THE INVENTION

Technical Field

The present disclosure relates to a key switch device and a key switch control method.

Background

For example, in e-sports where multiple users compete in a game, a key switch device such as a controller or a keyboard operated by each user is used. In e-sports, many operations are performed by repeatedly hitting the same key from among various keys installed in a key switch device. The high operating speed of the same key (a large number of inputs in a given time) often leads to a game victory. For this reason, a key switch device that is capable of a faster input operation has been desired.

Japanese Unexamined Patent Application Publication No. 2018-067134 discloses a keyboard device that is provided with multiple keys and capable of setting multiple threshold values for each key. For example, by making it possible to select three threshold values: a "small threshold value" with a shallow pressing amount, a "medium threshold value" with a medium pressing amount, and a "large threshold value" with a deep pressing amount, and setting a threshold value for each key to one of the above threshold values, it becomes possible to set each key installed in the key switch device to an operability suitable for the user's preference.

SUMMARY OF THE INVENTION

However, in the technique disclosed in Patent Document 1, for example, setting a key to a small threshold value makes it faster to detect an initial input operation (on-detection), but the distance for the key to reach the full-stroke point after exceeding the threshold value increases. For this reason, it takes a long time to detect the return of the key (off-detection), making it difficult to repeatedly hit the same key at high speed.

Meanwhile, setting a key to a greater threshold value makes it easier to hit the same key repeatedly, but the initial input operation (on-detection) is delayed, causing a problem that is not suitable for e-sports that compete on input speed.

The present disclosure has been made in order to solve the above problems, and an object of the present disclosure is to provide a key switch device and a key switch control method with which it is possible to detect a key operation at an early timing and hit the same key repeatedly at a high speed.

A key switch device according to the present disclosure includes: a key that is configured to output a signal corresponding to a pressing amount; a pressing amount detector that is configured to detect the pressing amount of the key; an A/D converter that is configured to convert the pressing amount of the key into digital data; an operating point storage unit that is configured to store multiple operating points for switching between ON and OFF states of the key according to the digital data; and an output signal control unit that is configured to output an ON signal when the pressing amount exceeds any one of the operating points in a direction in which the pressing amount of the key increases, and to output an OFF signal when the pressing amount falls below any one of the operating points in a direction in which the pressing amount of the key decreases.

A key switch control method according to the present disclosure is a key switch control method for switching between ON and OFF states of a key according to a pressing amount of the key, and includes: a step of detecting the pressing amount of the key; a step of converting the pressing amount of the key into digital data; and a step of, based on the digital data and multiple operating points for switching between ON and OFF states of the key, outputting an ON signal when the pressing amount exceeds any one of the operating points in a direction in which the pressing amount of the key increases, and outputting an OFF signal when the pressing amount falls below any one of the operating points in a direction in which the pressing amount of the key decreases.

BRIEF DESCRIPTION OF DRAWINGS

FIG. 5 is a timing chart illustrating a relationship between pressing amounts and changes between ON and OFF in the key switch device according to the embodiment.

DETAILED DESCRIPTION OF THE INVENTION

Description of Embodiment

Figure 1:
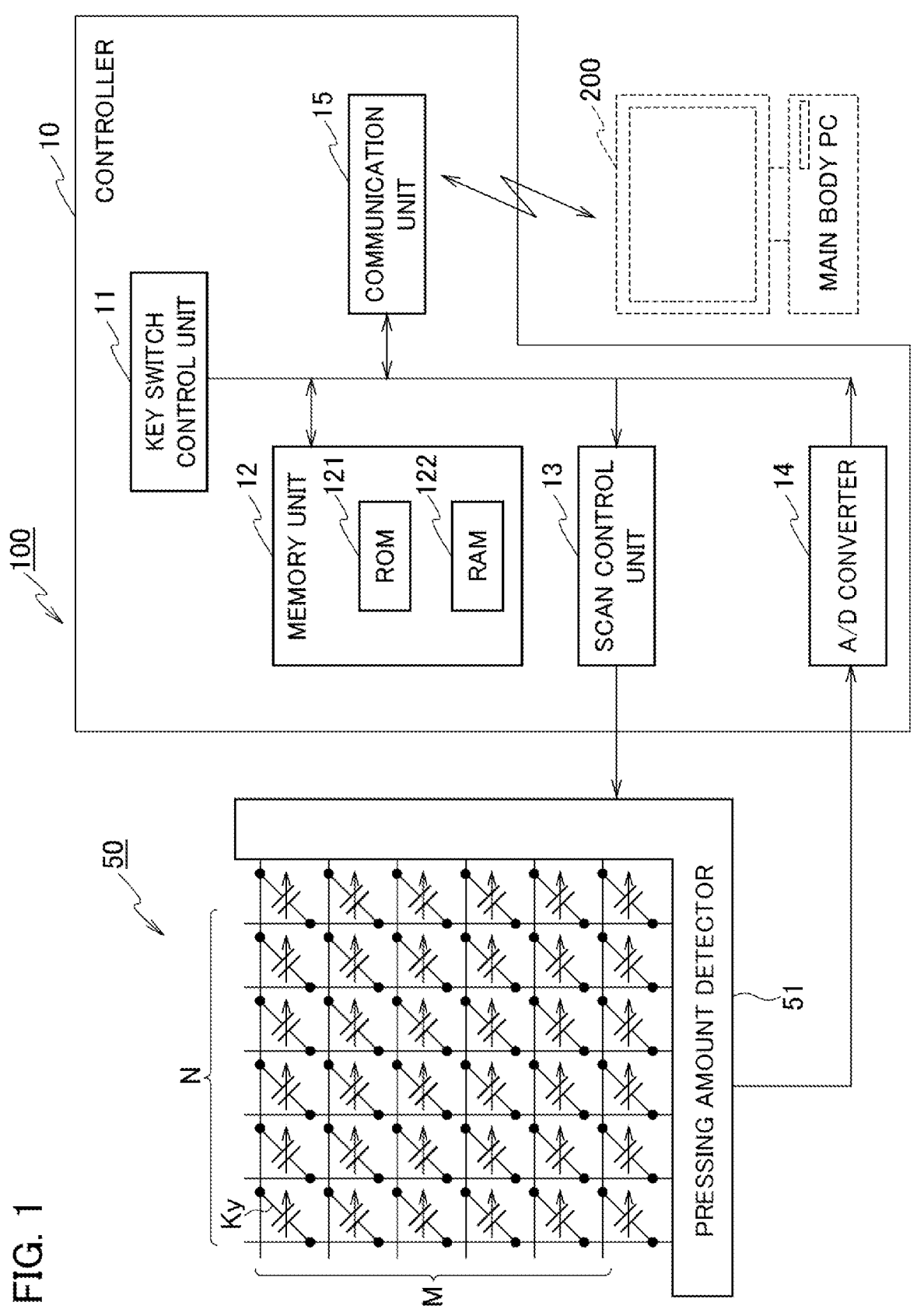
FIG. 1 is a block diagram illustrating a configuration of a key switch device and peripheral units of the key switch device according to an embodiment.

An embodiment of the present invention will be described below with reference to the drawings. FIG. 1 is a block diagram illustrating a configuration of a key switch device 100 and peripheral units of the key switch device 100 according to the embodiment. More specifically, the key switch device 100 is a computer keyboard provided with a large number of keys.

As illustrated in FIG. 1, the key switch device 100 according to the present embodiment includes a controller 10 and a key matrix 50.

The key matrix 50 is provided with multiple drive lines M and multiple keys Ky connected to multiple sensing lines N. The key matrix 50 includes a pressing amount detector 51 that scans each key Ky to detect the pressing amount of each key Ky.

Each key Ky has an electrode opposed to the bottom of a key top, and the capacitance changes when pressing the key top. That is, each key Ky outputs a signal corresponding to a pressing amount. The configuration of the key Ky will be described below with reference to FIGS. 2 and 3.

Figure 2:
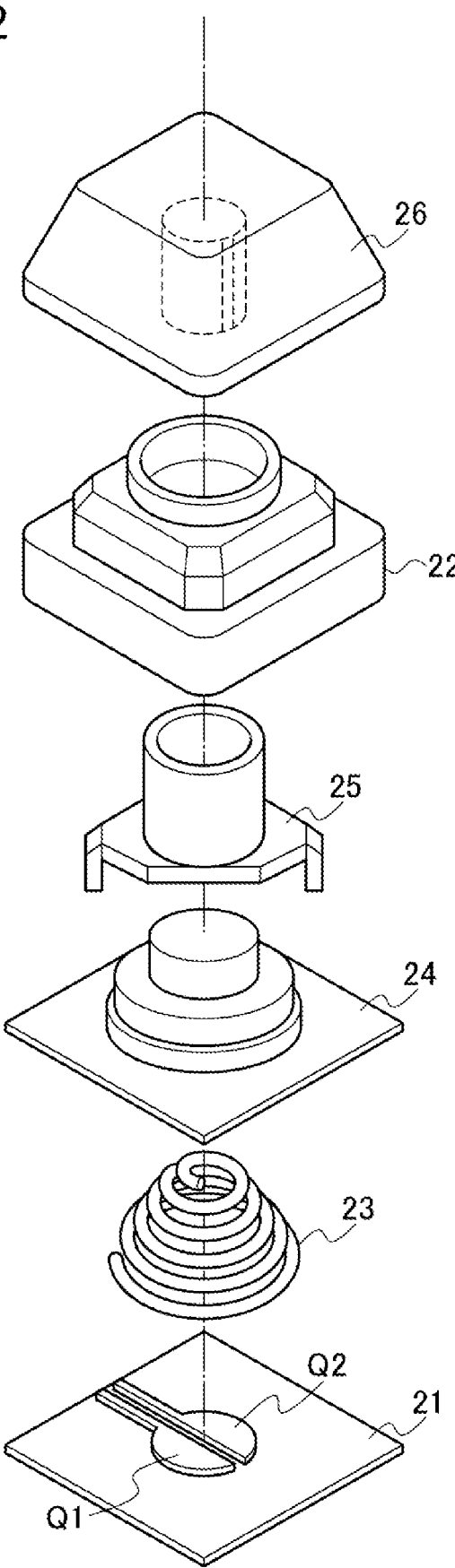
FIG. 2 is an exploded perspective view illustrating a structure of a key.
Figure 3:
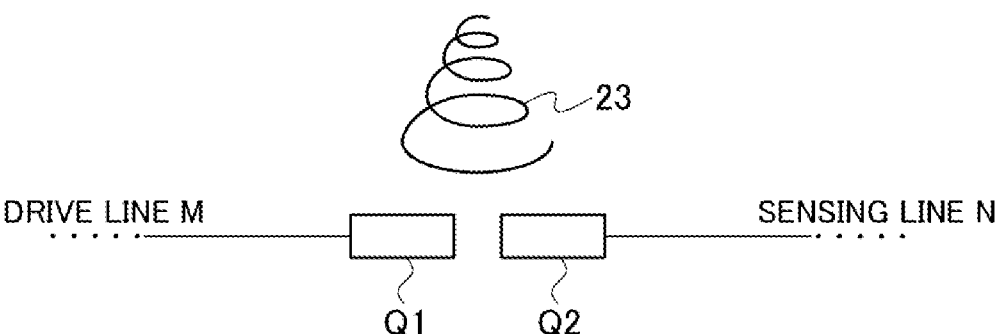
FIG. 3 is an explanatory diagram illustrating how a capacitance between two electrodes Q1 and Q2 changes according to the expansion and contraction of a coil spring.

As illustrated in FIG. 2, the key Ky includes a substrate 21 provided with a pair of electrodes Q1 and Q2, and a housing 22. A cone-shaped coil spring 23, flexible rubber 24, and a plunger 25 are provided between the substrate 21 and the housing 22. Please note that the electrodes Q1 and Q2 and the coil spring 23 are electrically insulated by an insulating layer that is not illustrated, and thus form a capacitance.

Further, a key top 26 is provided above the housing 22, and when the operator presses the key top 26, the coil spring 23 is energized and the capacitance between the electrodes Q1 and Q2 changes. That is, the key Ky is configured such that the capacitance between the electrodes Q1 and Q2 increases according to the pressing amount that is generated when pressing the key top 26.

The key Ky is not particularly limited to the structure illustrated in FIG. 2 as long as the capacitance between the electrodes increases according to the pressing amount that is generated when pressing the key top 26. In addition, the key Ky may be configured such that an output, more specifically an analog voltage, increases monotonically according to the pressing amount of a key.

Of the two electrodes Q1 and Q2 provided in the key Ky, one electrode Q1 is connected to a drive line M and the other electrode Q2 is connected to a sensing line N. Specifically, as illustrated in the schematic diagram of FIG. 3, the electrodes Q1 and Q2 are arranged opposite to each other at a certain distance, and the electrode Q1 is connected to the drive line M and the electrode Q2 is connected to the sensing line N. Then, since the capacitance between the electrodes Q1 and Q2 changes according to the expansion and contraction state of the coil spring 23 provided between the two electrodes Q1 and Q2 (that is, the pressing amount of the key top 26 illustrated in FIG. 2), the current flowing from the electrode Q1 to the electrode Q2 changes accordingly. Therefore, the voltage detected by the pressing amount detector 51 (see FIG. 1) changes.

Other than a capacitive key switch, an analog input device with which it is possible to output a pressing amount in an analog quantity may be applied, such as an electromagnetic system, an optical system, or an electrical resistance system. An analog input device with which the output analog quantity changes linearly with respect to the pressing amount is preferable.

The pressing amount detector 51 illustrated in FIG. 1 detects the capacitance generated in each key Ky, sequentially selects one key Ky from among the multiple keys Ky, and detects the pressing amount of the selected key Ky. The pressing amount detector 51 outputs data of the detected pressing amount (analog value) to an analog/digital (A/D) converter 14.

The controller 10 includes a key switch control unit 11, a memory unit 12, a scan control unit 13, the A/D converter 14, and a communication unit 15. For example, the controller 10 can be configured as an integrated computer including a central processing unit (CPU), and storage means such as a RAM, a ROM, and a hard disk.

The key switch control unit 11 performs control for scanning each key Ky by means of the scan control unit 13, control for writing and reading data in and from the memory unit 12, and control for communication with a main body PC 200 by means of the communication unit 15. The key switch control unit 11 also determines whether each key Ky is ON or OFF on the basis of a digital signal output from the A/D converter 14 and a threshold value stored in the memory unit 12 (the details will be described later).

Further, as for the control for sequentially scanning each key Ky to detect the pressing amount thereof and storing the digital signal in the memory unit 12, and as for the control for sequentially reading the pressing amount of each key Ky stored in the memory unit 12 and determining whether each key Ky is ON or OFF by using operating points which will be described later, these forms of control are performed independently of each other and are not affected by other forms of control.

In addition, the key switch control unit 11 sets an operating point that switches between ON and OFF with respect to the pressing amount of each key Ky, on the basis of a setting signal input by the main body PC 200. In the present embodiment, an example will be described in which three operating points AP1, AP2, and AP3 are set. For example, values for three operating points AP1, AP2, and AP3 are set for each key Ky when the pressing amount of the key Ky is indicated by a digital value of 0 to 255.

In addition, an ON threshold value and an OFF threshold value are set for each of the operating points AP1 to AP3. The ON threshold value of the operating point AP1 is set to a first ON threshold value AP1ON, the ON threshold value of the operating point AP2 is set to a second ON threshold value AP2ON, and the ON threshold value of the operating point AP3 is set to a third ON threshold value AP3ON. Further, the OFF threshold value of the operating point AP1 is set to a first OFF threshold value AP1OFF, the OFF threshold value of the operating point AP2 is set to a second OFF threshold value AP2OFF, and the OFF threshold value of the operating point AP3 is set to a third OFF threshold value AP3OFF.

Figure 5:
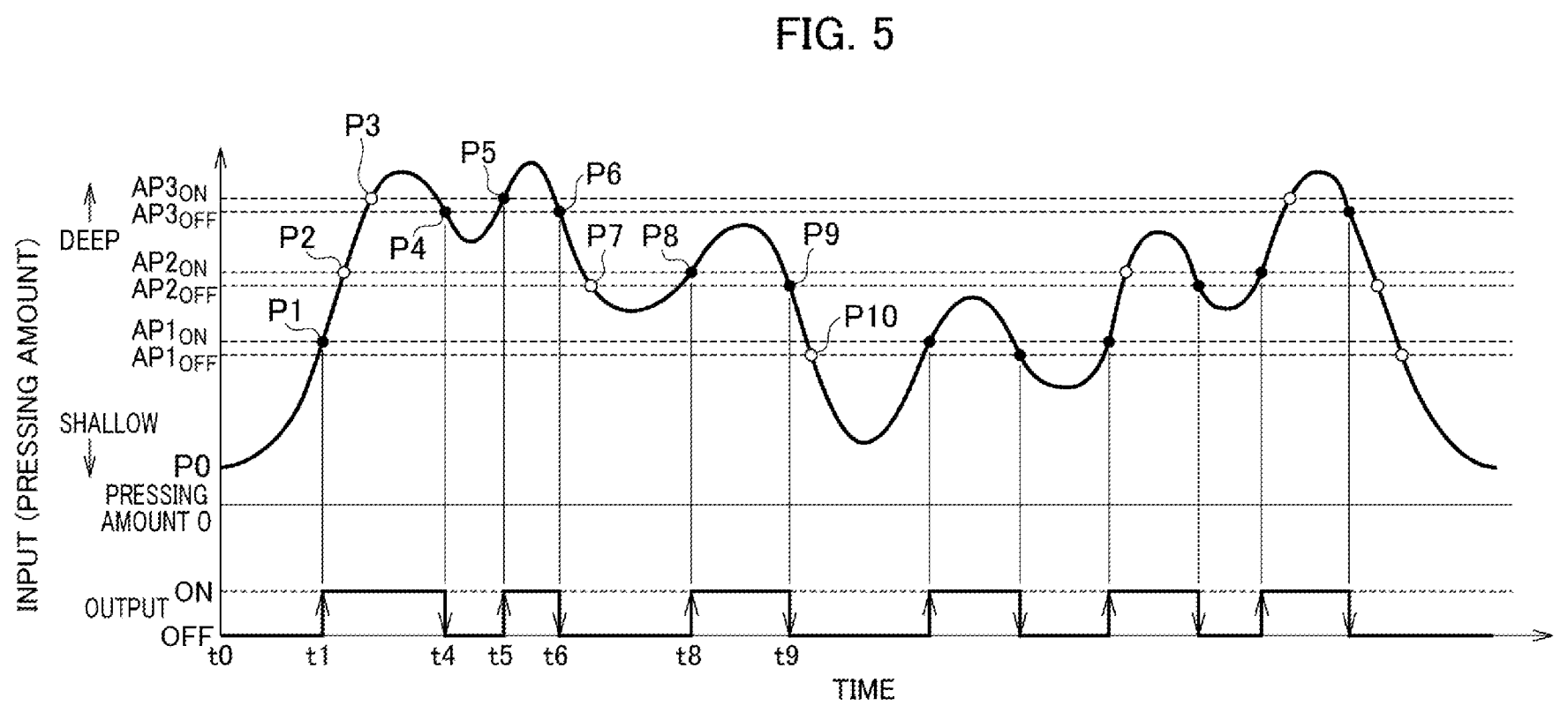

The magnitudes of the respective ON threshold values AP1ON, AP2ON, and AP3ON have a relationship of "AP1ON<AP2ON<AP3ON" as illustrated in FIG. 5. The magnitudes of the respective OFF threshold values AP1OFF, AP2OFF, and AP3OFF have a relationship of "AP1OFF<AP2OFF<AP3OFF".

The ON threshold value of each operating point AP1 to AP3 is considered to be slightly greater than the OFF threshold value. Specifically, the relationship is as follows: "AP1ON>AP1OFF", "AP2ON>AP2OFF", and "AP3ON>AP3OFF". That is, three operating points AP1, AP2, and AP3 are set for one key Ky, and in order to ensure hysteresis for each operating point, the ON threshold values are set slightly greater than the OFF threshold values.

In addition, the key switch control unit 11 has the function of outputting an ON signal when the pressing amount exceeds any one of the ON threshold values in the direction in which the pressing amount of the key Ky increases, and outputting an OFF signal when the pressing amount falls below any one of the OFF threshold values in the direction in which the pressing amount of the key Ky decreases.

The memory unit 12 includes a ROM 121 (read only memory) and a RAM 122 (random access memory). The ROM 121 stores control programs for the entire device, or the like.

The RAM 122 stores a threshold value indicating an operating point of each key Ky. Specifically, the RAM 122 stores each of the aforementioned ON threshold values AP1ON to AP3ON, and each of the aforementioned OFF threshold values AP1OFF to AP3OFF. The RAM 122 also stores pressing amount data (digital data converted by the A/D converter 14) of each key Ky when the scanning of each key Ky is performed. That is, the RAM 122 has the function of an operating point storage unit that stores multiple operating points for switching between ON and OFF states of each key Ky according to the digital data. Further, the RAM 122 has a pressing amount storage unit that stores the pressing amount of each key Ky for each key Ky.

The communication unit 15 performs wireless or wired communication with the main body PC 200. Specifically, the communication unit 15 transmits ON and OFF information of each key Ky to the main body PC 200. Further, the communication unit 15 receives various setting value data that is set in the main body PC 200. The setting values that are set in the main PC include ON threshold value data and OFF threshold value data of each key Ky, and information to enable or disable each key Ky.

[Description of Control for Storing Pressing Amount of Each Key in Memory]

The scan control unit 13 sequentially selects a key address for each key Ky arranged in a matrix and scans each key Ky, on the basis of an instruction output from the key switch control unit 11. When the scan control unit 13 scans each key Ky, a voltage corresponding to a capacitance generated in each key Ky is detected by the pressing amount detector 51.

The A/D converter 14 converts the pressing amount of each key Ky (analog data) that is output from the pressing amount detector 51 into digital data of 0 to 255, for example. The A/D converter 14 outputs the converted pressing amount (digital data) to the key switch control unit 11. The key switch control unit 11 stores the digital data in a location (a pressing amount storage unit) specified for each key Ky in the RAM 122.

[Description of Control for Determining ON or OFF State of Each Key]

Figure 4A:
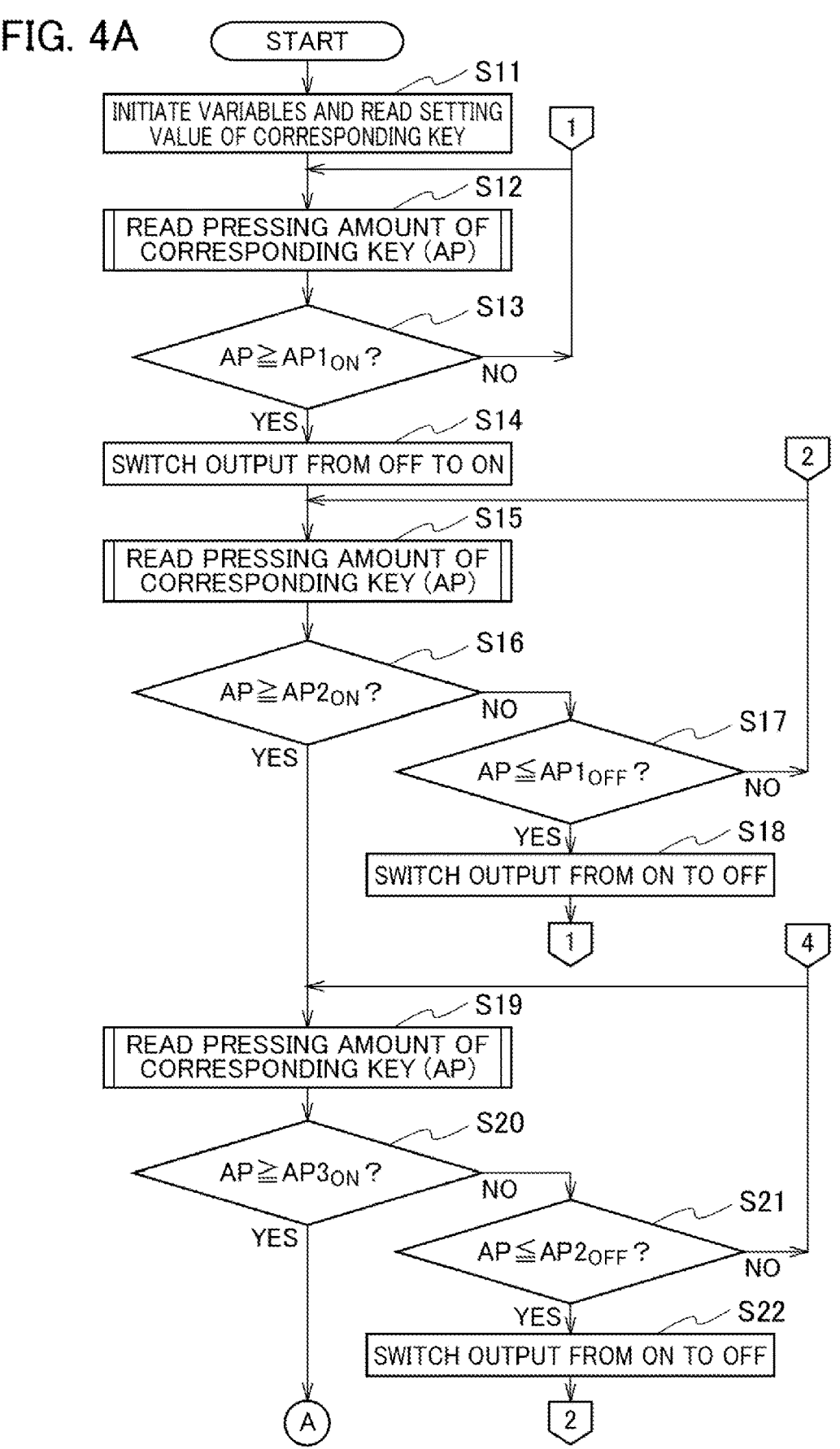
FIG. 4A is a first partial view of a flowchart illustrating an operation of the key switch device according to the embodiment.
Figure 4B:
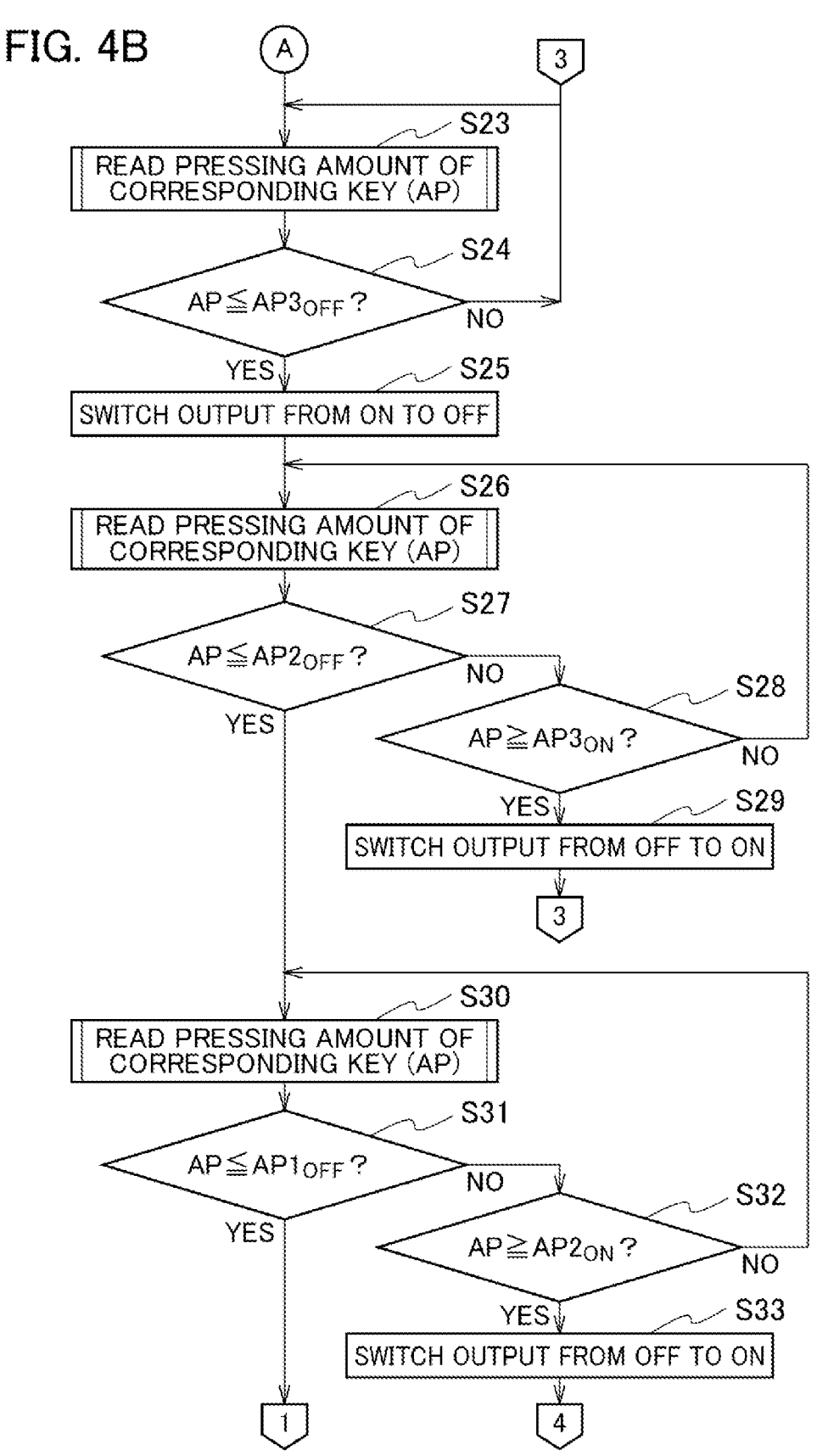
FIG. 4B is a second partial view of a flowchart illustrating an operation of the key switch device according to the embodiment.

Next, a description will be given regarding an operation for determining whether a key Ky of the key switch device 100 according to the present embodiment configured as described above is ON or OFF, with reference to the flowcharts illustrated in FIGS. 4A and 4B and the timing chart illustrated in FIG. 5. The processing illustrated in FIGS. 4A and 4B is executed by the controller 10 illustrated in FIG. 1. Specifically, there are (M×N) keys Ky as illustrated in FIG. 1, and ON or OFF is sequentially determined for each key Ky. Since the same control is applied for determining an ON or OFF state for each key Ky, only one key Ky1 that is a target for ON-OFF determination will be described in the following description.

First, in step S11 of FIG. 4A, the key switch control unit 11 initiates various variables to be used for the processing. Further, the key switch control unit 11 sets each key Ky to "OFF". Furthermore, the key switch control unit 11 reads, from the RAM 122, a threshold value that is set to the corresponding key Ky1. Specifically, for each key Ky arranged in a matrix, the key switch control unit 11 reads three ON threshold values AP1ON (a first ON threshold value), AP2ON (a second ON threshold value), AP3ON (a third ON threshold value), and reads three OFF threshold values AP1OFF (a first OFF threshold value), AP2OFF (a second OFF threshold value), and AP3OFF (a third OFF threshold value).

The magnitudes of the respective ON threshold values AP1ON, AP2ON, and AP3ON have a relationship of "AP1ON<AP2ON<AP3ON" as illustrated in FIG. 5. The magnitudes of the respective OFF threshold values AP1OFF, AP2OFF, and AP3OFF have a relationship of "AP1OFF<AP2OFF<AP3OFF". In addition, these threshold values have a relationship of "AP1ON>AP1OFF", "AP2ON>AP2OFF", and "AP3ON>AP3OFF". That is, three operating points AP1, AP2, and AP3 are set for one key Ky1, and in order to ensure hysteresis for each operating point, the value of the pressing amount that becomes ON is set slightly greater than the value of the pressing amount that becomes OFF.

In step S12, the scan control unit 13 reads the pressing amount of the key Ky1 from a designated location (a pressing amount storage unit) in the RAM 122. This pressing amount is defined as "pressing amount AP".

In step S13, the key switch control unit 11 determines whether the pressing amount AP of the key Ky1 is equal to or greater than the first ON threshold value AP1ON stored in the RAM 122. When "AP≥AP1ON" is obtained (S13: YES), the processing proceeds to step S14, otherwise the processing returns to step S12.

In step S14, the key switch control unit 11 switches the output of the key Ky1 from OFF to ON. That is, when the output of the key Ky1 is in an OFF state and the pressing amount AP of the key Ky1 exceeds any one of the three ON threshold values (in this case, the first ON threshold value AP1ON), the key switch control unit 11 switches the output of the key Ky1 from ON to OFF.

In step S15, the key switch control unit 11 reads the pressing amount AP of the key Ky1. When the user continues to press the key Ky1, the pressing amount AP keeps increasing, and when the user stops pressing the key Ky1, the pressing amount AP changes and starts to decrease.

In step S16, the key switch control unit 11 determines whether the pressing amount AP of the key Ky1 is greater than the second ON threshold value AP2ON.

When the user continues to press the key Ky1 and "AP≥AP2ON" is obtained (S16: YES), the key Ky1 remains in an ON state in step S19, and the key switch control unit 11 reads the pressing amount AP of the key Ky1. Thereafter, the processing proceeds to step S20.

In contrast, when the user stops pressing the key Ky1 and the pressing amount AP decreases and "AP≥AP2ON" is not obtained (S16: NO), in step S17, the key switch control unit 11 determines whether the pressing amount AP of the key Ky1 is less than or equal to the first OFF threshold value AP1OFF. When "AP≤AP1OFF" is obtained (S17: YES), the processing proceeds to step S18, otherwise the processing returns to step S15.

In step S18, the key switch control unit 11 switches the output of the key Ky1 from ON to OFF. That is, when the output of the key Ky1 is in an ON state and the pressing amount AP of the key Ky1 falls below any one of the three OFF threshold values (in this case, the first OFF threshold value AP1OFF), the key switch control unit 11 switches the output of the key Ky1 from ON to OFF. Thereafter, the processing returns to step S12.

In step S20, the key switch control unit 11 determines whether the pressing amount AP of the key Ky1 is greater than the third ON threshold value AP3ON.

When the user continues to press the key Ky1 and "AP≥AP3ON" is obtained (S20: YES), the key Ky1 remains in an ON state in step S23 of FIG. 4B, and the key switch control unit 11 reads the pressing amount AP of the key Ky1. Thereafter, the processing proceeds to step S24.

In contrast, when the user stops pressing the key Ky1 and the pressing amount AP decreases and "AP≥AP3ON" is not obtained (S20: NO), in step S21, the key switch control unit 11 determines whether the pressing amount AP of the key Ky1 is less than or equal to the second OFF threshold value AP2OFF. When "AP≤AP2OFF" is obtained (S21: YES), the processing proceeds to step S22, otherwise the processing returns to step S19.

In step S22, the key switch control unit 11 switches the output of the key Ky1 from ON to OFF. That is, when the output of the key Ky1 is in an ON state and the pressing amount AP of the key Ky1 falls below any one of the three OFF threshold values (in this case, the second OFF threshold value AP2OFF), the key switch control unit 11 switches the output of the key Ky1 from ON to OFF. Thereafter, the processing returns to step S15.

In step S24, the key switch control unit 11 determines whether the pressing amount AP of the key Ky1 has fallen below the third OFF threshold value AP3OFF. When "AP≤AP3OFF" is obtained (S24: YES), the processing proceeds to step S25, otherwise the processing returns to step S23.

In step S25, the key switch control unit 11 switches the output of the key Ky1 from ON to OFF. That is, when the output of the key Ky1 is in an ON state and the pressing amount AP of the key Ky1 falls below any one of the three OFF threshold values (in this case, the third OFF threshold value AP3OFF), the key switch control unit 11 switches the output of the key Ky1 from ON to OFF. Thereafter, the processing proceeds to step S26.

In step S26, the key switch control unit 11 reads the pressing amount AP of the key Ky1.

In step S27, the key switch control unit 11 determines whether the pressing amount AP of the key Ky1 is equal to or less than the second OFF threshold value AP2OFF.

When the user has not pressed the key Ky1 and "AP≥AP2OFF" is obtained (S27: YES), the key Ky1 remains in an OFF state in step S30, and the key switch control unit 11 detects the pressing amount AP of the key Ky1. Thereafter, the processing proceeds to step S31.

In contrast, when the user starts to press the key Ky1 and the pressing amount of AP increases and "AP≥AP2OFF" is not obtained (S27: NO), in step S28, the key switch control unit 11 determines whether the pressing amount AP of the key Ky1 is greater than the third ON threshold value AP3ON. When "AP≤AP3ON" is obtained (S28: YES), the processing proceeds to step S29, otherwise the processing returns to step S26.

In step S29, the key switch control unit 11 switches the output of the key Ky1 from OFF to ON. That is, when the output of the key Ky1 is in an OFF state and the pressing amount AP of the key Ky1 exceeds any one of the three ON threshold values (in this case, the third ON threshold value AP3ON), the key switch control unit 11 switches the output of the key Ky1 from OFF to ON. Thereafter, the processing returns to step S23.

In step S30, the key switch control unit 11 reads the pressing amount AP of the key Ky1.

In step S31, the key switch control unit 11 determines whether the pressing amount AP of the key Ky1 is less than or equal to the first OFF threshold value AP1OFF.

When the user has not pressed the key Ky1 and "AP≥P1OFF" is obtained (S31: YES), the processing returns to step S12 of FIG. 4A.

In contrast, when the user starts to press the key Ky1 and the pressing amount AP increases and "AP≤AP1OFF" is not obtained (S31: NO), in step S32, the key switch control unit 11 determines whether the pressing amount AP of the key Ky1 is greater than the second ON threshold value AP2ON. When "AP≥AP2ON" is obtained (S32: YES), the processing proceeds to step S33, otherwise the processing returns to step S30.

In step S33, the key switch control unit 11 switches the output of the key Ky1 from OFF to ON. That is, when the output of the key Ky1 is in an OFF state and the pressing amount AP of the key Ky1 exceeds any one of the three ON threshold values (in this case, the second ON threshold value AP2ON), the key switch control unit 11 switches the output of the key Ky1 from OFF to ON. Thereafter, the processing returns to step S19 of FIG. 4A. In this way, the key Ky1 can be switched between ON and OFF states according to an increase or decrease in the pressing amount AP of the key Ky1.

[Specific Description of Switching Between ON and OFF States]

Next, a specific description of switching between ON and OFF states of the key Ky1 will be described with reference to a timing chart illustrated in FIG. 5.

Initially, as illustrated in time t0 of FIG. 4, the pressing amount AP of the key Ky1 is approximately 0 (see the reference numeral of P0). When the user starts to press the key Ky1 and the pressing amount AP exceeds the first ON threshold value AP1ON at time t1 (see the reference numeral of P1), the output of the key Ky1 is switched from OFF to ON. That is, when it is determined that "AP≥AP1ON" is obtained in step S13 illustrated in FIG. 4A, the output of the key Ky1 is set to ON in step S14.

When the key Ky1 is pressed continuously and the pressing amount of AP exceeds the second ON threshold value AP2ON (see the reference numeral of P2), the output of the key Ky1 remains in an ON state. That is, when it is determined that "AP≥AP2ON" is obtained in step S16 illustrated in FIG. 4A, the output of the key Ky1 is maintained as ON.

Thereafter, when the key Ky1 is further pressed continuously and the pressing amount of AP exceeds the third ON threshold value AP3ON (see the reference numeral of P3), the output of the key Ky1 is maintained as ON. That is, when it is determined that "AP≥AP3ON" is obtained in step S20 illustrated in FIG. 4A, the output of the key Ky1 is maintained as ON.

When the pressing amount AP of the key Ky1 changes and starts to decrease and the pressing amount AP falls below the third OFF threshold value AP3OFF at time t4 (see the reference numeral of P4), the output of the key Ky1 is switched from ON to OFF. That is, when it is determined that "AP≤AP3OFF" is obtained in step S24 illustrated in FIG. 4B, the output of the key Ky1 is set to OFF in step S25.

When the pressing amount AP of the key Ky1 changes and starts to increase and the pressing amount AP exceeds the third ON threshold value AP3ON at time t5 (see the reference numeral of P5), the output of the key Ky1 is switched from OFF to ON. That is, when it is determined that "AP≥AP3ON" is obtained in step S28 illustrated in FIG. 4B, the output of the key Ky1 is set to ON in step S29.

Thereafter, when the pressing amount AP of the key Ky1 changes and starts to decrease and the pressing amount AP falls below the third OFF threshold value AP3OFF at time t6 (see the reference numeral of P6), the output of the key Ky1 is switched from ON to OFF.

When the pressing amount AP of the key Ky1 further decreases and the pressing amount AP falls below the second OFF threshold value AP2OFF (see the reference numeral of P7), the output of the key Ky1 is maintained as OFF.

When the pressing amount AP of the key Ky1 changes and starts to increase and the pressing amount AP exceeds the second ON threshold value AP2ON at time t8 (see the reference numeral of P8), the output of the key Ky1 is switched from OFF to ON.

When the pressing amount AP of the key Ky1 changes and starts to decrease and the pressing amount AP falls below the second OFF threshold value AP2OFF at time t9 (see the reference numeral of P9), the output of the key Ky1 is switched from ON to OFF.

When the pressing amount AP of the key Ky1 further decreases and the pressing amount AP falls below the first OFF threshold value AP1OFF (see the reference numeral of P10), the output of the key Ky1 is maintained as OFF. Thereafter, the same processing as described above will be performed.

Thus, in the key switch device 100 according to the present embodiment, multiple ON threshold values and multiple OFF threshold values are set for the pressing amount of the key Ky. When the pressing amount AP of the key Ky exceeds any one of multiple ON threshold values in a state in which the output of the key Ky is OFF, the output of the key Ky is switched from OFF to ON. In addition, when the pressing amount AP of the key Ky falls below any one of multiple OFF threshold values in a state in which the output of the key Ky is ON, the output of the key Ky is switched from ON to OFF.

Accordingly, when the user presses the key Ky, the key Ky can be switched from OFF to ON at the time when the pressing amount AP is small. In addition, when the user stops pressing the key Ky after the key Ky becomes ON, the pressing amount AP decreases, and when the pressing amount AP falls below any one of multiple OFF threshold values, the output of the key Ky is switched from ON to OFF.

For this reason, the output of the key Ky can be switched from ON to OFF immediately. In addition, when the user starts to press the key Ky, the pressing amount AP increases, and when the pressing amount AP exceeds any one of multiple ON threshold values, the output of the key Ky is switched from OFF to ON. This makes it possible to switch between ON and OFF states of the key Ky in an extremely fast cycle when hitting the same key Ky repeatedly. That is, this make it possible to increase the number of ON/OFF switching operations that can be performed in a given time.

In addition, the magnitudes of the respective ON threshold values AP1ON, AP2ON, and AP3ON and the respective OFF threshold values AP1OFF, AP2OFF, and AP3OFF have a relationship of "AP1OFF<AP1ON", "AP2OFF<AP2ON", and "AP3OFF<AP3ON". That is, hysteresis is ensured between the threshold values at which the key Ky becomes ON and the threshold values at which the key Ky becomes OFF. This prevents the key Ky from repeatedly switching between ON and OFF states unnecessarily.

DESCRIPTION OF MODIFIED EXAMPLE

In the embodiment described above, a description has been given regarding an example in which the key Ky is switched between ON and OFF states using three ON threshold values AP1ON to AP3ON and three OFF threshold values AP1OFF to AP3OFF, which are set in the RAM 122 in advance.

In this modified example, for example, four or more operating points are set by the program of the main PC and are temporarily stored in the RAM 122 via the communication unit 15. Further, it is also possible to specify three of the four or more operating points and set such three points as the above three operating points AP1 to AP3.

Specifically, ON and OFF threshold values corresponding to four or more operating points may be stored in the RAM 122 in advance, three ON threshold values set in the main body PC 200 may be set to the above first to third ON threshold values AP1ON to AP3ON, and three OFF threshold values set in the main body PC 200 may be set to the above first to third OFF threshold values AP1OFF to AP3OFF.

That is, the key switch control unit 11 (output signal control unit) may acquire selection signals of desired multiple operating points from among the multiple operating points stored in the RAM 122 (operating point storage unit), and set multiple operating points set by the acquired selection signals, to operating points for switching between ON and OFF states of the key Ky. This make it possible for the user to select three desired operating points (three ON threshold values and three OFF threshold values) from among multiple operating points (multiple ON threshold values and multiple OFF threshold values), thereby enabling the user to set operating points with good operability.

Further, five or more operating points may be set, and a quantity of operating points that is less than or equal to such five or more operating points may be selected as appropriate. That is, n operating points of AP1, AP2, . . . , and APn may be set. In this case, n ON threshold values of AP1ON, AP2ON, . . . , and APnON are set, and n OFF threshold values of AP1OFF, AP2OFF, . . . , and APnOFF are set, and the relationship between such ON and OFF threshold values is AP1ON<AP1OFF<AP2ON<AP2OFF<, APnON<APnOFF.

That is, it is also possible to set a large number of operating points in advance within a range of a pressing stroke of the key Ky, to select operating points which are to be used and those which are not to be used from the main body PC 200, and to perform ON/OFF output control of the key Ky only by using the operating points which are to be used.

This makes it possible to set operating points according to the habits and preferences of each user (for example, e-sports competitors), thereby making it possible for the users to compete to their satisfaction.

In the above embodiment, a keyboard connected to a computer is used as an example; however, the key switch device is not limited to a keyboard, and the present invention can be applied to an input switch for an arcade game, a joystick, and a controller for a home video game.

As noted above, although the embodiment of the present invention has been described, it should be understood that the arguments and drawings forming part of this disclosure are not intended to limit the present invention. Various alternative embodiments, examples, and operational techniques will be apparent to those skilled in the art from this disclosure.

The invention claimed is:

1. A key switch device comprising:

a key that is configured to output a signal corresponding to a pressing amount;

a pressing amount detector that is configured to detect the pressing amount of the key;

an A/D converter that is configured to convert the pressing amount of the key into digital data;

an operating point storage unit that is configured to store multiple operating points for switching between ON and OFF states of the key, each operating point having an OFF threshold value, and an ON threshold value greater than the respective OFF threshold value; and an output signal control unit that is configured to switch, according to the digital data, an output of the key from OFF to ON when the output of the key is in the OFF state and the pressing amount exceeds any one of the ON threshold values in a direction in which the pressing amount of the key increases, and to switch, according to the digital data, the output of the key from ON to OFF when the output of the key is in the ON state and the pressing amount falls below any one of the OFF threshold values in a direction in which the pressing amount of the key decreases.

2. The key switch device according to claim 1, wherein the output signal control unit acquires selection signals of desired multiple operating points from among the multiple operating points stored in the operating point storage unit, and sets multiple operating points set by the acquired selection signals, to operating points for switching between ON and OFF states of the key.

3. The key switch device according to claim 1, wherein the operating points have n operating points of AP1, AP2, . . . , and APn, and a relationship between ON threshold values AP1ON, AP2ON, . . . , and APnON of the respective operating points and OFF threshold values AP1OFF, AP2OFF, . . . , and APnOFF of the respective operating points is AP1OFF<AP1ON<AP2OFF<AP2ON<, . . . , APnOFF<APnO.

4. A key switch control method for switching between ON and OFF states of a key according to a pressing amount of the key, comprising:

a step of outputting a signal corresponding to the pressing amount of the key;

a step of detecting the pressing amount of the key;

a step of converting the pressing amount of the key into digital data;

a step of storing multiple operating points for switching, according to the digital data, between the ON and OFF states of the key, each operating point having an OFF threshold value, and an ON threshold value greater than the respective OFF threshold value; and a step of, based on the digital data and multiple operating points for switching between the ON and OFF states of the key, switching the output of the key from OFF to ON when the output of the key is in the OFF state and the pressing amount exceeds any one of the ON threshold values in a direction in which the pressing amount of the key increases, and switch the output of the key from ON to OFF when the output of the key is in the ON state and the pressing amount falls below any one of the OFF threshold values in a direction in which the pressing amount of the key decreases.

* * * * *